(12) United States Patent
Tsukada

(10) Patent No.: US 7,755,467 B2
(45) Date of Patent: Jul. 13, 2010

(54) CHIP RESISTOR

(75) Inventor: Torayuki Tsukada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 372 days.

(21) Appl. No.: 11/990,405

(22) PCT Filed: Aug. 2, 2006

(86) PCT No.: PCT/JP2006/315289

§ 371 (c)(1),
(2), (4) Date: Feb. 13, 2008

(87) PCT Pub. No.: WO2007/020802

PCT Pub. Date: Feb. 22, 2007

(65) Prior Publication Data

US 2009/0160602 A1    Jun. 25, 2009

(30) Foreign Application Priority Data

Aug. 18, 2005   (JP)   ............................. 2005-237095
Aug. 18, 2005   (JP)   ............................. 2005-237096

(51) Int. Cl.
*H01C 10/00*   (2006.01)
(52) U.S. Cl. ................... 338/195; 338/332; 338/307
(58) Field of Classification Search ................ 338/307, 338/308, 309, 195, 332; 257/359
See application file for complete search history.

(56) References Cited

U.S. PATENT DOCUMENTS

| 5,680,092 | A | * | 10/1997 | Yamada et al. ............. 338/309 |
| 6,023,217 | A |   | 2/2000  | Yamada et al. |
| 6,084,502 | A | * | 7/2000  | Ariga et al. ................. 338/195 |
| 6,144,287 | A | * | 11/2000 | Komeda ..................... 338/195 |
| 6,356,184 | B1 | * | 3/2002 | Doi et al. .................... 338/309 |
| 6,359,546 | B1 | * | 3/2002 | Oh ............................. 338/313 |
| 7,098,768 | B2 | * | 8/2006 | Doi ............................ 338/309 |
| 7,286,039 | B2 |   | 10/2007 | Yoneda |
| 7,326,999 | B2 | * | 2/2008 | Tsukada ..................... 257/359 |

FOREIGN PATENT DOCUMENTS

| JP | 57-201801   | 12/1982 |
| JP | 8-213202    | 8/1996  |
| JP | 2003-282301 | 10/2003 |
| JP | 2005-93717  | 4/2005  |
| TW | 424245      | 3/2001  |
| TW | 465787      | 11/2001 |

OTHER PUBLICATIONS

International Search Report from the corresponding PCT/JP2006/315289, mailed Sep. 5, 2006.

* cited by examiner

*Primary Examiner*—Kyung Lee
(74) *Attorney, Agent, or Firm*—Hamre, Schumann, Mueller & Larson, P.C.

(57) ABSTRACT

The chip resistor (1) of the present invention includes a pair of terminal electrodes (4, 5) provided at ends of an insulating substrate (2) in the form of a chip, and a resistor film (3) formed on the upper surface of the insulating substrate (2) for electrical connection to the paired terminal electrodes (4, 5) and formed with a trimming groove (3*a*) for setting the resistance. The paired terminal electrodes (4, 5) include a lower electrode (4*b*) formed on the lower surface of the insulating substrate (2). The lower electrode (4*b*) extends up to a position directly below a narrower portion (8) of the resistor film (3) which has a relatively small width due to the formation of the trimming groove (3*a*) in the resistor film (3).

8 Claims, 5 Drawing Sheets

CHIP RESISTOR

TECHNICAL FIELD

The present invention relates to a chip resistor including an insulating substrate in the form of a chip and a resistor film formed on the insulating substrate.

BACKGROUND ART

As disclosed in e.g. Patent Document 1, this kind of chip resistor conventionally includes a pair of terminal electrodes provided on ends of the insulating substrate which is in the form of a chip. The resistor film is formed on the upper surface of the insulating substrate to extend between the ends of the insulating substrate.

Patent Document 1: JP-A-H08-213202

Each of the terminal electrodes comprises an upper electrode formed on the upper surface of the insulating substrate to be electrically connected to the resistor film, a lower electrode formed on the lower surface of the insulating substrate and a side electrode formed on an end surface of the insulating substrate to overlap part of the upper electrode and part of the lower electrode. A solder plating layer is formed on the surfaces of the upper electrode, the lower electrode and the side electrode. The chip resistor is mounted on e.g. a printed board by soldering the paired terminal electrodes on to the board.

The resistor film of the chip resistor is formed with a trimming groove or a slit at a longitudinal edge thereof. By forming the trimming groove, the resistance of the chip resistor is set to lie within a predetermined allowable range. The width of the portion of the resistor film at which the trimming groove is formed is smaller than that of other portions.

When the chip resistor is energized, the resistor film is heated. Specifically, during the energization, the portion of the resistor film which has a relatively small width due to the provision of the trimming groove is mainly heated. The heat generated at this portion is transferred to the terminal electrodes at the ends of the insulating substrate, and more specifically, to the upper electrodes, and then transferred to the printed board through the side electrodes and the lower electrodes.

In this way, in this chip resistor, the heat generated at the resistor film is transferred to the printed board only in the longitudinal direction of the insulating substrate. Thus, the heat mainly generated at the portion of the resistor film which has a relatively small width due to the provision of the groove is not efficiently transferred to the printed board, so that the temperature of the resistor film may become too high.

DISCLOSURE OF THE INVENTION

The present invention, which is proposed under the above-described circumstances, is to provide a chip resistor having enhanced heat transfer efficiency.

According to a first aspect of the present invention, there is provided a chip resistor comprising an insulating substrate in the form of a chip, a pair of terminal electrodes provided at ends of the insulating substrate, and a resistor film formed on an upper surface of the insulating substrate to be electrically connected to the paired terminal electrodes and formed with a slit for setting the resistance. Each of the paired terminal electrodes includes a lower electrode formed on a lower surface of the insulating substrate. One of the lower electrodes extends up to a position directly below a portion of the resistor film which has a relatively small width due to the existence of the slit.

According to a second aspect of the present invention, there is provided a chip resistor comprising an insulating substrate in the form of a chip, a pair of terminal electrodes provided at ends of the insulating substrate, and a resistor film formed on a lower surface of the insulating substrate to be electrically connected to the paired terminal electrodes and formed with a slit for setting the resistance. Each of the paired terminal electrodes includes a lower electrode formed on a cover coat covering the resistor film. One of the lower electrodes extends up to a position directly below a portion of the resistor film which has a relatively small width due to the existence of the slit.

Preferably, the chip resistor is configured to be mounted on a board by soldering the lower electrodes onto the board.

Preferably, the slit is provided at a position closer to either one of the paired terminal electrodes in a longitudinal direction of the resistor film.

Preferably, two slits are provided to be arranged in a longitudinal direction of the resistor film. The lower electrode of one of the terminal electrodes extends up to a position directly below a portion of the resistor film which has a relatively small width due to the existence of one of the two slits, whereas the lower electrode of the other one of the terminal electrodes extends up to a position directly below a portion of the resistor film which has a relatively small width due to the existence of the other one of the two slits.

BEST MODE FOR CARRYING OUT THE INVENTION

Preferred embodiments of the present invention will be described below with reference to the accompanying drawings. It should be noted that the same or similar elements are designated by the same reference signs throughout the figures.

Figure 1:
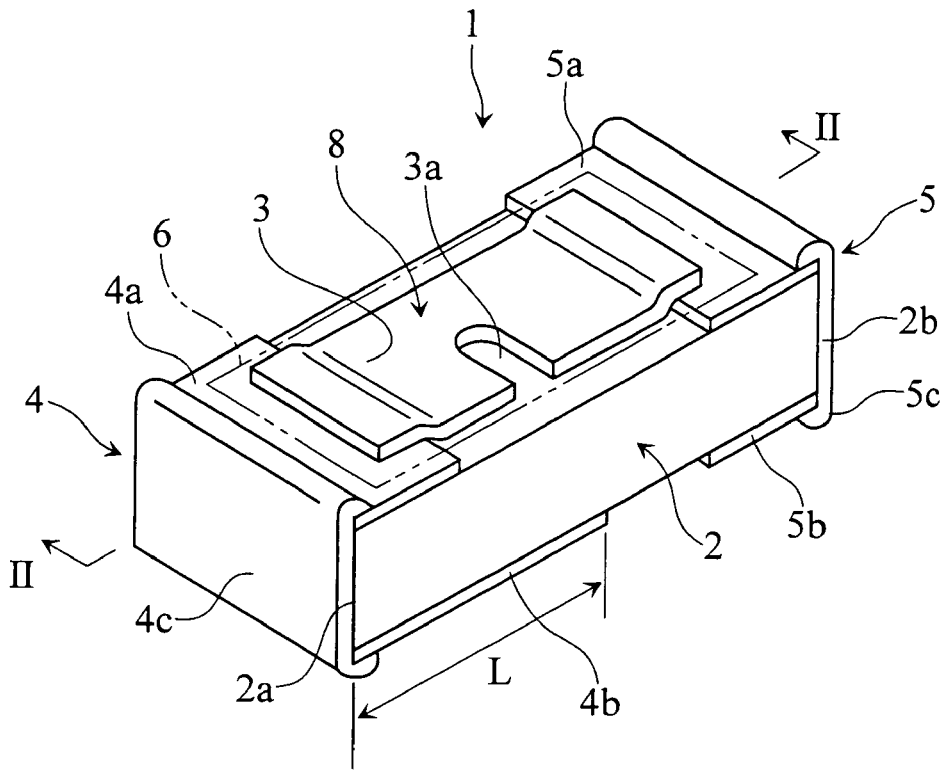
FIG. 1 is a perspective view showing a chip resistor according to a first embodiment of the present invention.
Figure 2:
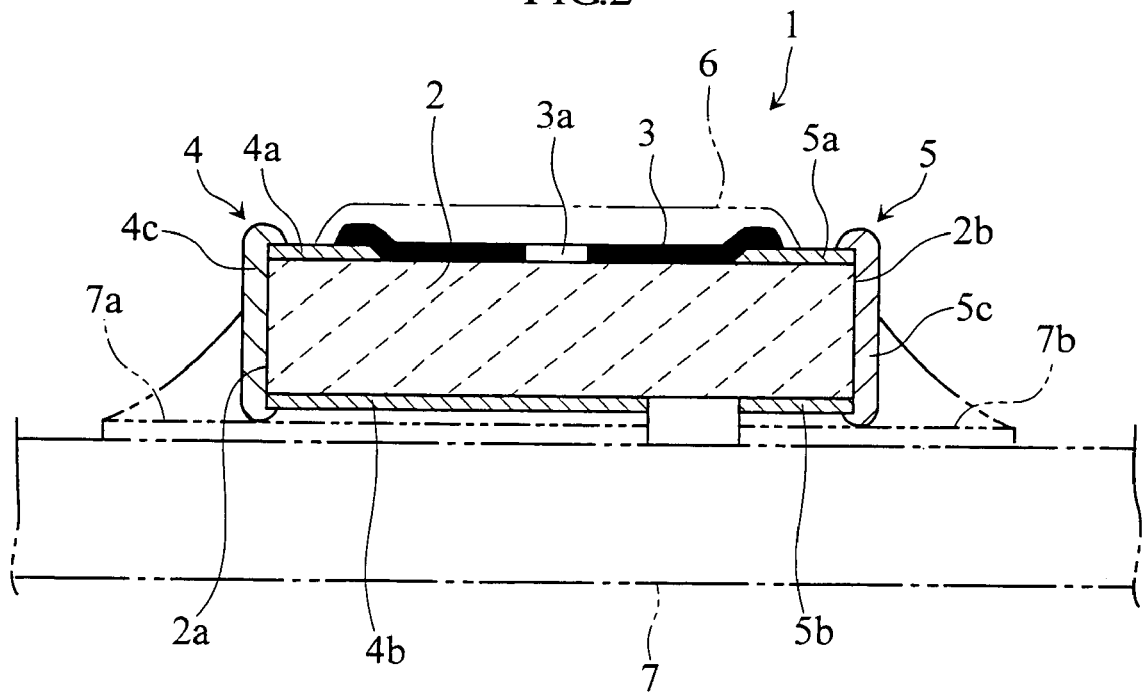
FIG. 2 is a sectional view taken along lines II-II in FIG. 1.

FIGS. 1 and 2 show a chip resistor 1 according to a first embodiment of the present invention.

The chip resistor 1 includes an insulating substrate 2 in the form of a chip (i.e., thin plate with an elongated rectangular shape in plan view) and a pair of terminal electrodes 4, 5 formed at ends of the insulating substrate 2. The paired terminal electrodes 4, 5 comprise upper electrodes 4a, 5a formed on the upper surface of the insulating substrate 2, lower electrodes 4b, 5b formed on the lower surface of the insulating substrate 2 and side electrodes 4c, 5c formed on the end surfaces 2a, 2b of the insulating substrate 2 to be electrically connected to the upper electrodes 4a, 5a and the lower electrode 4b, 5b.

The upper surface of the insulating substrate 2 is formed with a resistor film 3 extending in the longitudinal direction of the insulating substrate 2. The resistor film 3 has ends electrically connected to the upper electrodes 4a, 5a. A cover coat 6 (see FIG. 2) made of e.g. glass is formed on the insulating substrate 2 to cover the entirety of the resistor film 3. Though not illustrated, a solder plating layer is formed on the surfaces of the upper electrodes 4a, 5a, the lower electrodes 4b, 5b and the side electrodes 4c, 5c.

The resistor film 3 is formed with a trimming groove 3a (or a slit) at a prescribed position in the longitudinal direction of the film. By forming the trimming groove 3a, the resistance of the resistor film 3 is set to lie within a predetermined allowable range. The width of the portion of the resistor film 3 at which the trimming groove 3a is formed is smaller than that of other portions. Hereinafter, the portion 8 of the resistor film 3 which has a relatively small width is referred to as "narrower portion 8". The trimming groove 3a may be formed by performing trimming after the resistor film 3 is formed. Alternatively, the trimming groove 3a may be formed in forming the resistor film 3 by screen printing.

The lower electrode 5b has a length substantially equal to that of the upper electrode 5a. The other lower electrode 4b is longer than the upper electrode 5a and extends up to the position directly below the narrower portion 8 of the resistor film 3. That is, the dimension L of the lower electrode 4b in the longitudinal direction of the resistor film 3 is longer than that of the lower electrode 5b.

As shown in FIG. 2, the chip resistor 1 is mounted on a printed board 7 by soldering the side electrodes 4c, 5c and the lower electrodes 4b, 5b of the terminal electrodes 4, 5 provided at the ends thereof onto electrode pads 7a, 7b of the printed board 7.

When the chip resistor 1 mounted on a board by soldering is energized, the narrower portion 8 of the resistor film 3 is heated. The heat generated at the narrower portion 8 is transferred in the longitudinal direction of the insulating substrate 2 toward the upper electrodes 4a, 5a provided at the ends. The heat is then transferred from the upper electrodes 4a, 5a to the printed board 7 through the side electrodes 4c, 5c and the lower electrode 4b, 5b. The heat generated at the narrower portion 8 is also transferred through the insulating substrate 2 in the thickness direction toward the lower electrode 4b positioned directly below the narrower portion and then transferred from the lower electrode 4b to the printed board 7. Thus, the efficiency of transfer of heat generated mainly at the narrower portion 8 of the resistor film 3 to the printed board 7 is considerably enhanced as compared with a chip resistor in which the lower electrode 4b is not extended, i.e., the length of the lower electrode 4b is substantially equal to that of the upper electrode 4a.

Preferably, as shown in FIG. 2, the electrode pad 7a of the printed board 7 for the lower, electrode 4b has such a size that the entirety of the lower electrode 4c comes into contact with the electrode pad. With this arrangement, the efficiency of heat transfer to the printed board 7 is further enhanced.

Figure 3:
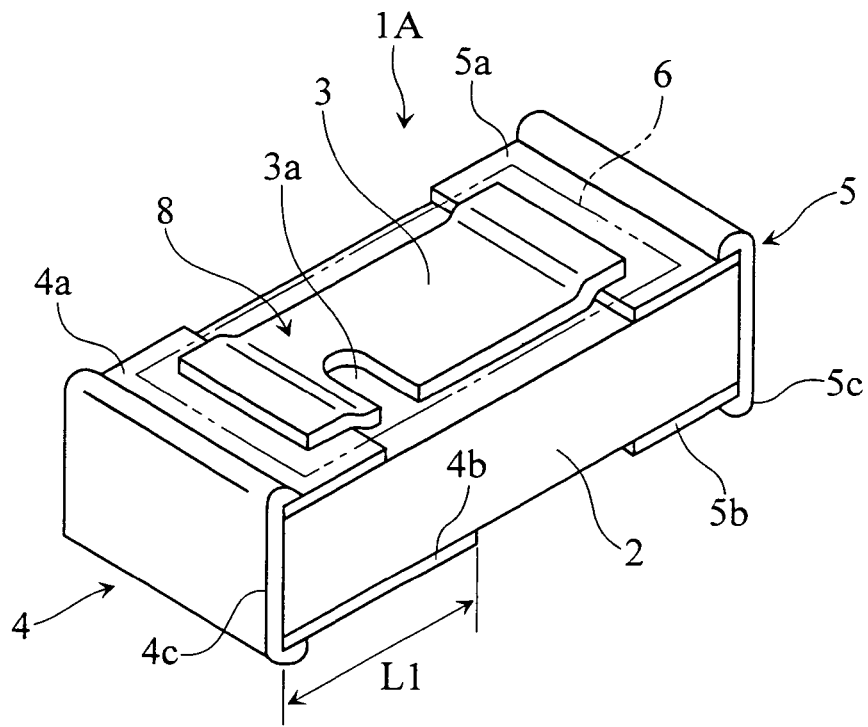
FIG. 3 is a perspective view showing a chip resistor according to a second embodiment of the present invention.

FIG. 3 shows a chip resistor 1A according to a second embodiment of the present invention.

In the chip resistor 1A, the trimming groove 3a is provided in the resistor film 3 at a position adjacent to the terminal electrode 4. Thus, the narrower portion 8 is positioned adjacent to the terminal electrode 4. The lower electrode 4b extends up to the position directly below the narrower portion 8. The structure of other portions is the same as that of the first embodiment.

In the chip resistor 1A, the length L1, i.e., the dimension of the lower electrode 4b in the longitudinal direction of the resistor film 3 is shorter than the length L in the chip resistor 1 of the first embodiment by as much as the narrower portion 8 is positioned closer to the terminal electrode 4. As a result, the material of the parts is saved, and the weight and cost of the parts is reduced. It is to be noted that the trimming groove 3a of the resistor film 3 may be provided adjacent to the terminal electrode 5 and the dimension of the lower electrode 5b in the longitudinal direction of the resistor film 3 may be extended to reach the position directly below the narrower portion 8.

Figure 4:
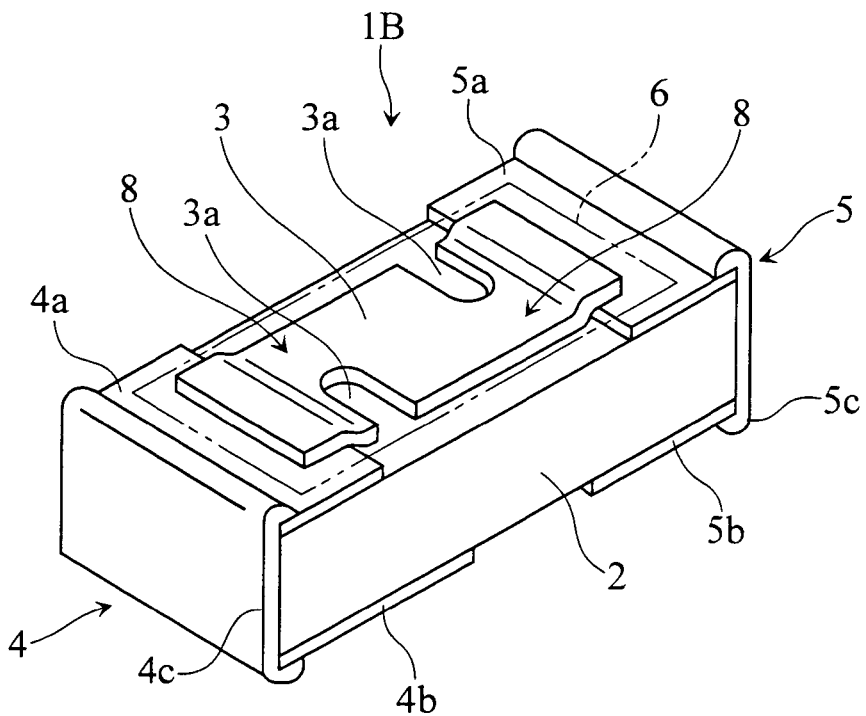
FIG. 4 is a perspective view showing a chip resistor according to a third embodiment of the present invention.

FIG. 4 shows a chip resistor 1B according to a third embodiment of the present invention.

In the chip resistor 1B according to the third embodiment, two trimming grooves 3a are provided in the resistor film 3. Thus, the resistor film 3 includes two narrower portions 8 arranged in the longitudinal direction of the resistor film 3.

The lower electrode 4b of the terminal electrode 4 extends up to the position directly be low one of the two narrower portions 8. The lower electrode 5b of the terminal electrode 5 extends up to the position directly below the other one of the two narrower portions 8. The structure of other portions is the same as that of the first embodiment.

In the chip resistor 1B, the heat generation in the resistor film 3 occurs dispersively at the two narrower portions 8. The generated heat is quickly transferred to the printed board 7 through the lower electrodes 4b, 5b positioned directly below the narrower portions 8 via the insulating substrate 2. Thus, the temperature of the resistor film 3 is reduced effectively.

In the chip resistor 1B of the third embodiment again, the narrower portions 8 may be provided adjacent to the terminal electrodes 4, 5 similarly to the chip resistor 1B of the second embodiment.

Figure 5:
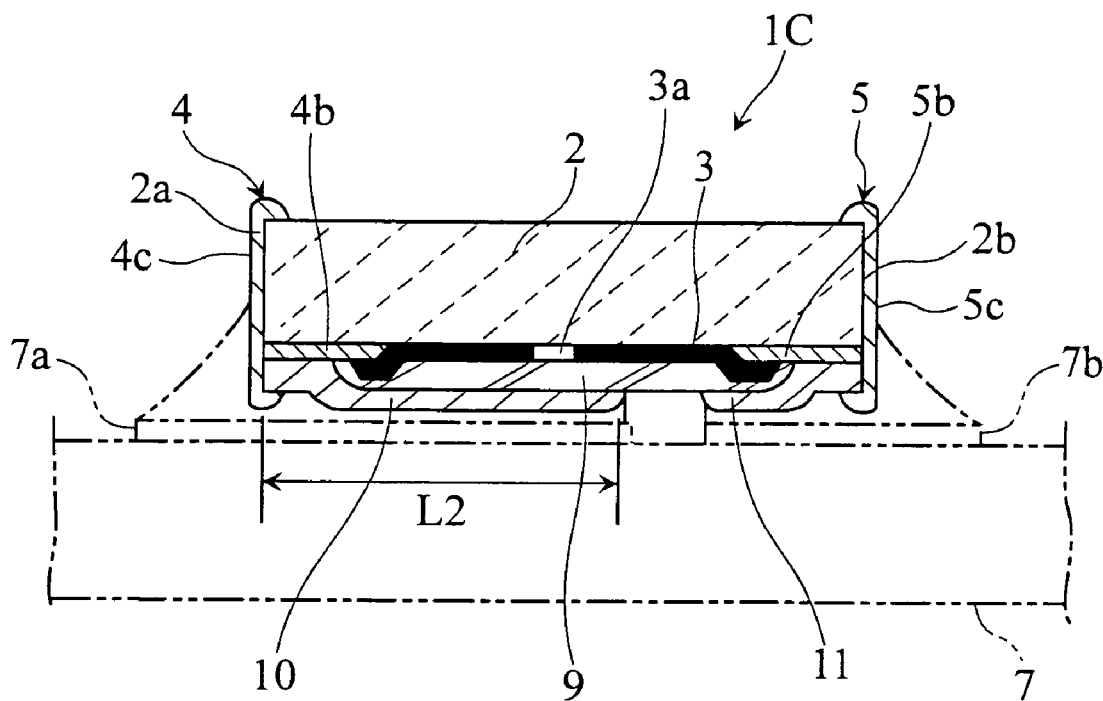
FIG. 5 is a longitudinal sectional view showing a chip resistor according to a fourth embodiment of the present invention.
Figure 6:
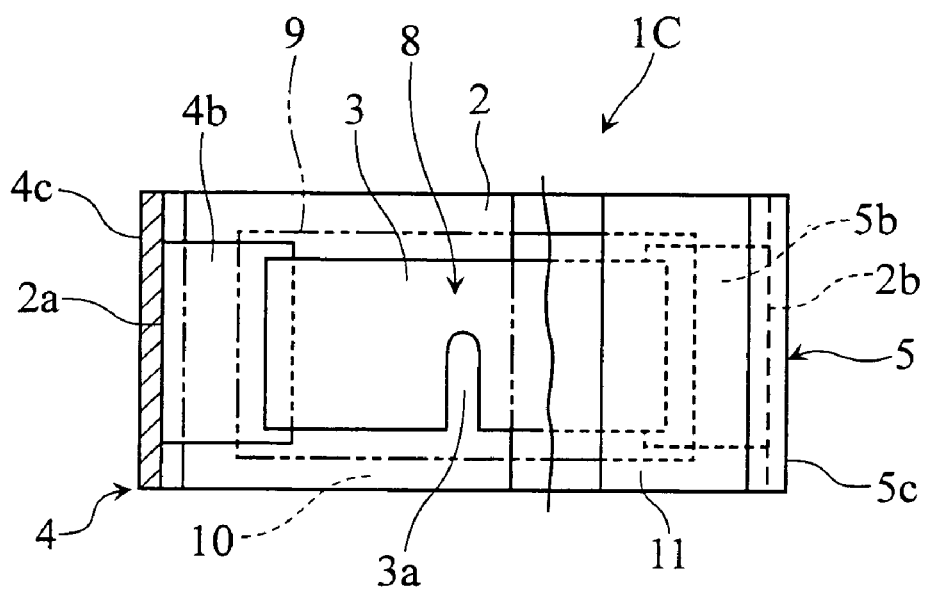
FIG. 6 is a bottom view partially cut away, showing the chip resistor of FIG. 5.

FIGS. 5 and 6 show a chip resistor 1C according to a fourth embodiment of the present invention.

In the chip resistor 1C, the paired terminal electrodes 4, 5 provided at ends of the insulating substrate 2 comprise lower electrodes 4b, 5b formed on the lower surface of the insulating substrate 2 and side electrodes 4c, 5c formed on the end surfaces 2a, 2b of the insulating substrate 2 to be electrically connected to the lower electrode 4b, 5b. Unlike the chip resistor 1 of the first embodiment, the chip resistor 1C does not include upper electrodes 4a, 5a.

The lower surface of the insulating substrate 2 is formed with a resistor film 3 extending in the longitudinal direction of the insulating substrate 2. The ends of the resistor film 3 are electrically connected to the lower electrodes 4b, 5b. The resistor film 3 is covered with a cover coat 9 made of e.g. glass.

The chip resistor further includes an auxiliary electrode 10 covering surfaces of the lower electrode 4b of the terminal electrode 4 and the cover coat 9, and an auxiliary electrode 11 covering surfaces of the lower electrode 5b of the terminal electrode 5 and the cover coat 9.

The auxiliary electrode 11 has a length substantially equal to that of the lower electrode 5b. The auxiliary electrode 10 is longer than the lower electrode 4b and extends up to the position facing the narrower portion 8 of the resistor film 3. That is, the dimension L2 of the auxiliary electrode 10 in the longitudinal direction of the resistor film 3 is longer, than that of the auxiliary electrode 11.

Though not illustrated, a metal plating layer such as a solder layer for enhancing soldering is formed on the surfaces of the auxiliary electrodes 10, 11. Thus, the auxiliary electrodes 10, 11 function as the electrodes for soldering the chip resistor 1C onto a printed board 7.

As shown in FIG. 5, the chip resistor 1C is mounted to the printed board 7 by soldering the side electrodes 4c, 5c of the opposite terminal electrodes 4, 5 and the auxiliary electrodes 10, 11 onto electrode pads 7a, 7b of the printed board 7, with the resistor film 3 oriented downward. In this process, at least the portions of the auxiliary electrodes 10, 11 which cover the surface of the cover coat 9 are brought into contact with the electrode pads 7a, 7b of the printed board 7.

When the chip resistor 1C is energized, heat is generated at the narrower portion 8 of the resistor film 3. Since the portion of the auxiliary electrode 10 which overlaps the cover coat 9 is held in contact with or close to the printed board 7, the heat generated at the narrower portion 8 is quickly transferred to the printed board 7 through the portion of the auxiliary electrode 10 which is extended up to the narrower portion 8. Thus, the efficiency of transfer of heat generated mainly at the narrower portion 8 of the resistor film 3 to the printed board 7 is considerably enhanced as compared with a chip resistor having a conventional structure.

Figure 7:
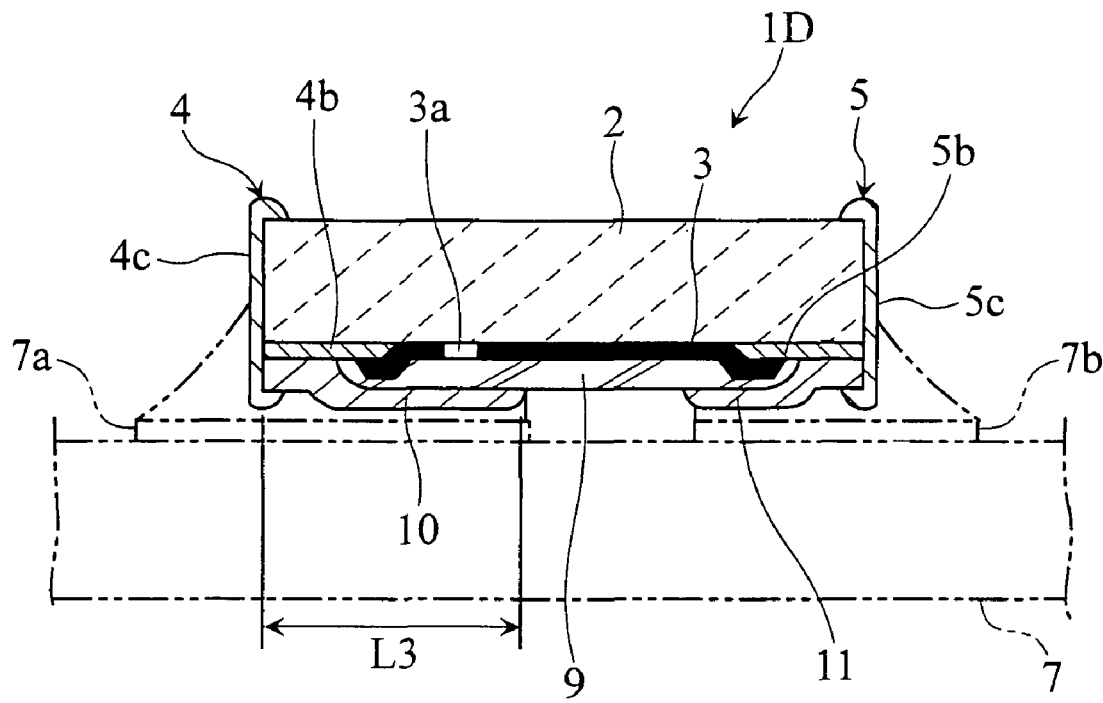
FIG. 7 is a longitudinal sectional view showing a chip resistor according to a fifth embodiment of the present invention.
Figure 8:
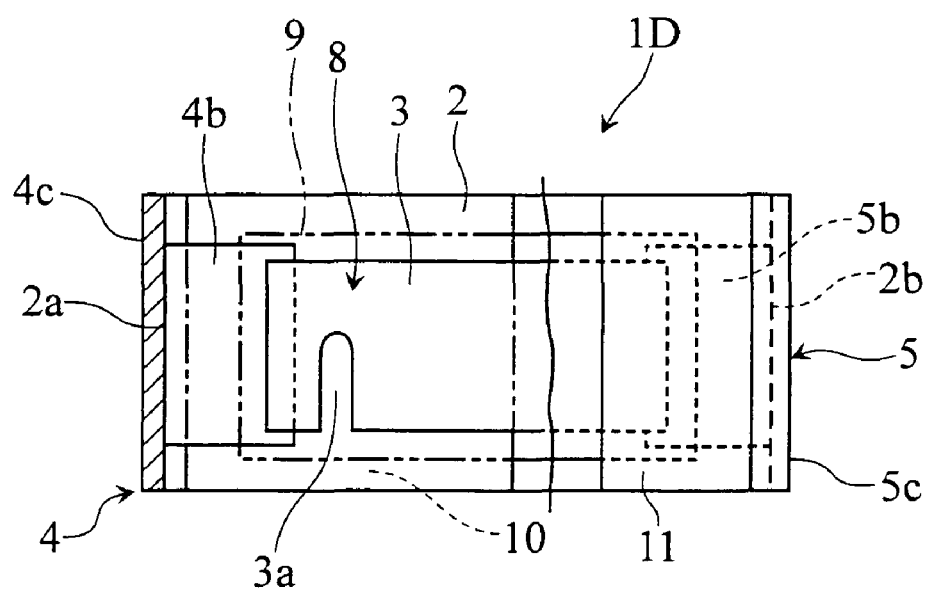
FIG. 8 is a bottom view partially cut away, showing the chip resistor of FIG. 7.

FIGS. 7 and 8 show a chip resistor 1D according to a fifth embodiment of the present invention.

In the chip resistor 1D, the trimming groove 3a is provided in the resistor film 3 at a position adjacent to the terminal electrode 4. Thus, the narrower portion 8 is positioned adjacent to the terminal electrode 4. The auxiliary electrode 10 extends up to the narrower portion 8 of the resistor film 3. The structure of other portions is the same as that of the fourth embodiment.

In the chip resistor 1D, the length L3, i.e., the dimension of the auxiliary electrode 10 in the longitudinal direction of the resistor film 3 is shorter than the length L2 in the chip resistor 1C of the fourth embodiment by as much as the narrower portion 8 is positioned closer to the terminal electrode 4. As a result, the material of the parts is saved, and the weight and cost of the parts is reduced. It is to be noted that the trimming groove 3a of the resistor film 3 may be provided adjacent to the terminal electrode 5 and the dimension of the auxiliary electrode 11 in the longitudinal direction of the resistor film 3 may be extended to reach the position directly below the narrower portion 8.

Figure 9:
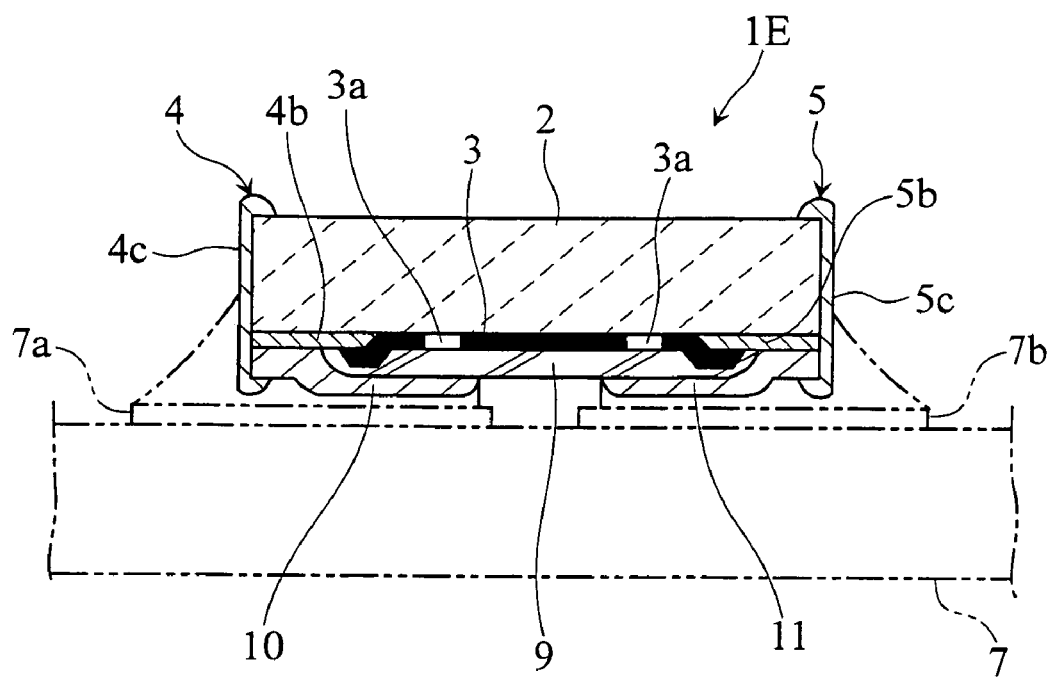
FIG. 9 is a longitudinal sectional view showing a chip resistor according to a sixth embodiment of the present invention.
Figure 10:
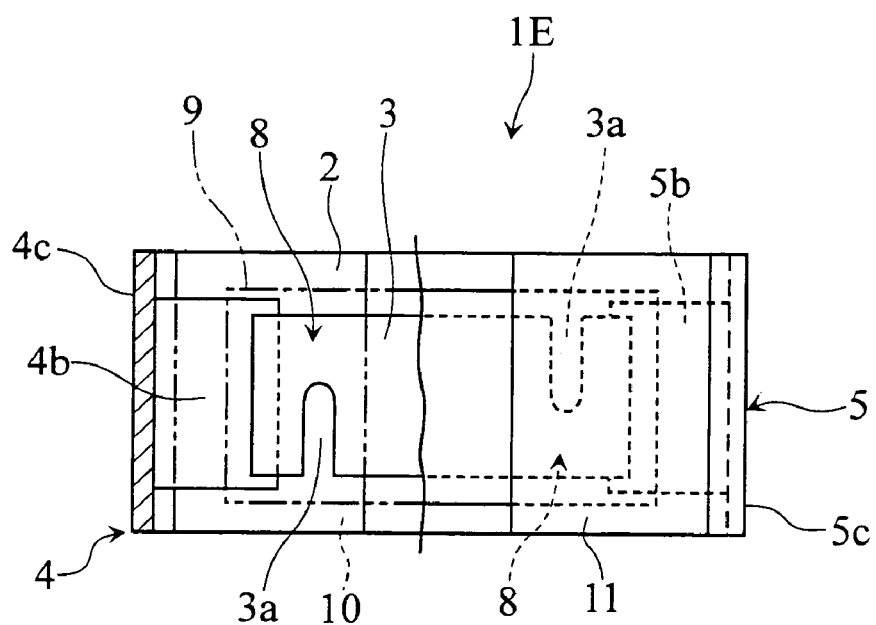
FIG. 10 is a bottom view partially cut away, showing the chip resistor of FIG. 9.

FIGS. 9 and 10 show a chip resistor 1E according to a sixth embodiment of the present invention.

In the chip resistor 1E according to the sixth embodiment, two trimming grooves 3a are provided in the resistor film 3. Thus, the resistor film 3 includes two narrower portions 8 arranged in the longitudinal direction of the resistor film 3.

The auxiliary electrode 10 extends up to one of the two narrower portions 8. The auxiliary electrode 11 extends up to the other one of the two narrower portions 8. The structure of other portions is the same as that of the fourth embodiment.

In the chip resistor 1E, the heat generation in the resistor film 3 occurs dispersively at the two narrower portions 8. The generated heat is quickly dissipated to the printed board 7 through the two auxiliary electrodes 10, 11 intervening between the cover coat 9 and the printed board 7. Thus, the temperature of the resistor film 3 is reduced effectively.

In the chip resistor 1E of the sixth embodiment again, the narrower portions 8 may be provided adjacent to the opposite terminal electrodes 4, 5 similarly to the chip resistor 1D of the fifth embodiment.

The present invention is not limited to the foregoing embodiments. For instance, the present invention is also applicable to a multiple chip resistor including a single insulating substrate formed with a plurality of resistor films and a pair of terminal electrodes formed at ends of each of the resistor films.

The specific structure of each part of the chip resistor according to the present invention may be varied in design in various ways without departing from the spirit of the invention.

The invention claimed is:

1. A chip resistor comprising: an insulating substrate in a form of a chip; a pair of terminal electrodes provided at ends of the insulating substrate; and a resistor film formed on an upper surface of the insulating substrate for electrical connection to the paired terminal electrodes and formed with a slit for setting resistance;

wherein each of the paired terminal electrodes includes a lower electrode formed on a lower surface of the insulating substrate; and wherein one of the lower electrodes extends up to a position directly below a portion of the resistor film having a relatively small width due to the slit.

2. A chip resistor comprising: an insulating substrate in a form of a chip; a pair of terminal electrodes provided at ends of the insulating substrate; and a resistor film formed on a lower surface of the insulating substrate for electrical connection to the paired terminal electrodes and formed with a slit for setting resistance;

wherein each of the paired terminal electrodes includes a lower electrode formed on a cover coat covering the resistor film; and wherein one of the lower electrodes extends up to a position directly below a portion of the resistor film having a relatively small width due to the slit.

3. The chip resistor according to claim 1, wherein the chip resistor is configured to be mounted on a board by soldering the lower electrodes onto the board.

4. The chip resistor according to claim 1, wherein the slit is disposed closer to one of the paired terminal electrodes in a longitudinal direction of the resistor film.

5. The chip resistor according to claim 1, wherein two slits are provided in a longitudinal direction of the resistor film, and wherein the lower electrode of one of the terminal electrodes extends up to a position directly below a portion of the resistor film which has a relatively small width due to existence of one of the two slits, whereas the lower electrode of the other one of the terminal electrodes extends up to a position directly below a portion of the resistor film which has a relatively small width due to existence of the other one of the two slits.

6. The chip resistor according to claim 2, wherein the chip resistor is configured to be mounted on a board by soldering the lower electrodes onto the board.

7. The chip resistor according to claim 2, wherein the slit is disposed closer to one of the paired terminal electrodes in a longitudinal direction of the resistor film.

8. The chip resistor according to claim 2, wherein two slits are provided in a longitudinal direction of the resistor film, and wherein the lower electrode of one of the terminal electrodes extends up to a position directly below a portion of the resistor film which has a relatively small width due to existence of one of the two slits, whereas the lower electrode of the other one of the terminal electrodes extends up to a position directly below a portion of the resistor film which has a relatively small width due to existence of the other one of the two slits.

* * * * *